Sept. 29, 1970 J. R. ASHMAN 3,531,603

MULTI-POSITION ROTARY ELECTRIC SWITCHES

Filed Dec. 2, 1968 2 Sheets-Sheet 1

United States Patent Office
3,531,603
Patented Sept. 29, 1970

3,531,603
MULTI-POSITION ROTARY ELECTRIC SWITCHES

John R. Ashman, Ilford, England, assignor to The Plessey Company Limited, Ilford, England, a British company Filed Dec. 2, 1968, Ser. No. 780,416
Int. Cl. H01h 19/58, 21/78
U.S. Cl. 200—11 5 Claims

ABSTRACT OF THE DISCLOSURE

A printed switch wafer for use in a rotary switch having bridging contact means comprises two rings of contact pads which have associated with them and with printed conductors interconnecting parts of relatively small surface area which can be selectively removed according to circuit requirements. The switch also has a novel bridging contact arrangement.

Figure 1:
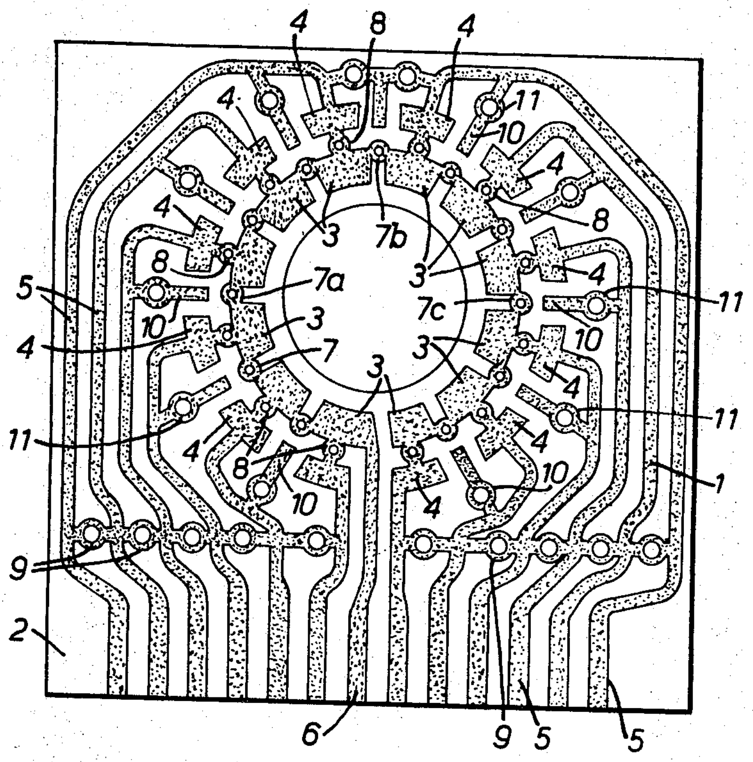

The invention relates to multi-position rotary electric switches and relates more specifically to such switches of the kind employing printed circuit wafers with which movable bridging contact means of the switch rotor co-operates.

The multiplicity of different circuits required to be provided by the printed circuit wafers of such switches and their cooperating rotor bridging contact means raises considerable problems since a large variety of different wafers need to be produced leading to unduly high manufacturing costs. Also it may not be possible for switch stockists to stock replacement wafers of all possible circuit configurations.

The present invention accordingly has in view for use in a rotary switch of the kind specified a printed switch wafer having printed thereon a ring of contact pads for selective engagement by the rotor bridging contact means of the switch and to which printed conductors extend, there being associated with the contact pads and the printed conductors interconnecting parts of relatively small surface area which can be selectively removed according to the particular circuit requirements to be met by the switch wafer.

By means of the present invention some measure of standardisation of printed wafers can be achieved leading to significant economies in the manufacture of wafers as well as improved availability.

In one especially contemplated printed wafer configuration two concentric rings of contact pads are provided so that corresponding pads of the two rings are arranged to be bridged in the radial direction by the rotor bridging contact means in appropriate angular positions of the switch rotor. In this configuration the aforesaid interconnecting parts may be provided between adjacent pads of one of the two rings of pads as well as between corresponding pads of the two rings. Printed conductors extending to the pads of one of such rings of pads may also have interconnecting parts extending between them. With this arrangement the number of poles of the switch may be varied by removing certain of the interconnecting parts between adjacent pads of the same ring while the circuitry can be varied as required by removing the short circuiting parts between corresponding pads of the two rings and between adjacent printed conductors. Thus it will be appreciated that a printed wafer having considerable versatility is afforded by the invention.

It is also contemplated that intermediate contact pads be provided between the pads of one of the rings previously referred to with interconnecting parts joining the intermediate pads to adjacent pads so that a "make" before "break" action is provided as the rotor bridging contact means moves from one pair of corresponding pads to another, the interconnecting parts are removed. This feature adds further to the versatility of the switch wafer.

According to another feature of the present invention the rotor bridging contact means of the switch of the kind hereinbefore specified comprises one or more pad bridging members of short length carried by the rotor body and acted on by individual spring means to urge the members into contact with the printed wafer.

This feature avoids the use as the rotor bridging contact means of wiper contact means having trailing fingers or wipers spaced apart radially and which define undesirably long inductive loop paths between them. In one construction of rotor especially envisaged the rotor body which is of cylindrical form has on one side a plurality of (e.g. twelve) of radially extending slots therein which define selected positions around the rotor for metal pad bridging members of channel shape acted on at their centres by coiled springs contained within recesses of the rotor body. In this way the bridging members are virtually floating at the ends of their associated springs and thus equal pressure is applied at the points of contact between the bridging member and corresponding contact pads of the printed wafer.

Figure 2:
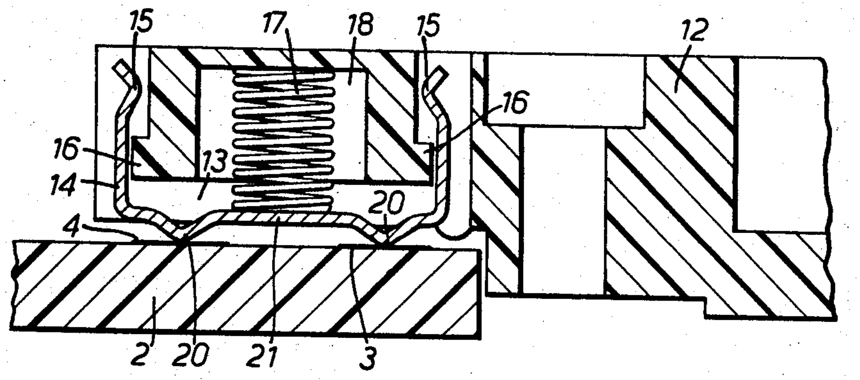
Figure 3:
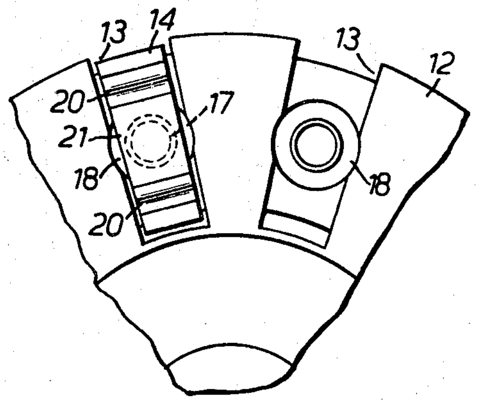

By way of example reference will now be made to the accompanying drawings, in which:

FIG. 1 is a plan view of a printed wafer for a rotary switch of the kind hereinbefore specified; and FIGS. 2 and 3 are fragmentary views of a rotor of a switch including the wafer of FIG. 1.

Referring firstly to FIG. 1 of the drawings the printed switch wafer shown comprises a printed conductor pattern 1 carried on one surface of an insulating substrate 2 of epoxy glass laminate to mention just one suitable material. The printed conductor pattern may be composed of gold-plated copper.

The pattern comprises two concentric rings of contact pads the pads of the inner ring being indicated at 3 and those of the outer ring being indicated at 4. The pads 4 have printed conductors 5 extending thereto from the bottom edge of the laminate 2 and one of the pads 3 has a conductor 6 extending to it also from the edge of laminate 2. In this particular example the printed conductors 5 and 6 are taken to the edge of the board so that the edge connections are facilitated but it should be understood that solder connections or wiring tag connections could also be made to the conductors of the printed pattern. It here may be mentioned that corresponding (i.e. radially aligned) pads are arranged to be bridged by rotor contacts to be described later in predetermined angular positions of the switch rotor.

In accordance with the present invention the pads 3 are joined together electrically by means of printed interconnecting parts shown at 7 which are conveniently of annular form in order to provide for ready siting of tools for the removal of the interconnecting material. These interconnecting parts 7 may be removed as desired in order to provide the requisite number of poles. For example a three-pole arrangement may be provided for by removing the annuli 7*a*, 7*b* and 7*c*. It will be seen that the pads 4 are also connected to corresponding pads 3 by annular interconnecting parts 8 and that these parts can be removed in order to isolate the pads 3 and 4 if permanent electrical bridging is not required according to the particular switch circuit arrangements.

Adjacent pads 4 are normally shorted by interconnecting parts 9 also conveniently of annular form for the reason just above specified and these parts 2 can be selectively removed as appropriate to provide the desired circuitry. For the purpose of affording "make" before "break" action conductive pads or strips 10 are provided between the pads 4 and are electrically connected to adjacent pads by annular interconnecting parts 11. If "make" before "break" action is not required the interconnecting part or parts 11 will be removed as appropriate.

Thus it will be appreciated that the particular printed wafer pattern affords good versatility and approaches the highly desirable condition of wafer standardisation, it simply being necessary to remove certain parts of the printed pattern in order to attain the desired switch circuitry. Such standardization is considered to more than effect the necessity of providing material which will subsequently be discarded and in spite of the work required in selectively discarding such material.

Although it is not essential it may be advantageous to provide holes in the laminate 2 at the centres of the interconnecting annuli if the tools for the removal of the material require such holes for their operation.

It will also be appreciated that although in the particular example described the conductive pattern is applied to one side only of the laminate 2 in actual practice double-sided patterned wafers will probably be used.

Turning now to FIGS. 2 and 3 of the drawings these show parts of the rotor of a switch in which the wafer of FIG. 1 will be embodied.

The switch rotor consists of a preferably moulded body 12 of generally cylindrical form which has radial slots 13 (e.g. twelve) formed therein for the location in selected ones thereof of bridging contact members 14 one of which can best be seen in FIG. 3. This bridging member is arranged to bridge corresponding pads 3 and 4 of the two rings of pads in FIG. 1 and is attached to the rotor body by clip-like ends 15 which snap-over projections 16 of the rotor body. The bridging members are acted on by coiled springs such as the spring 17 which are accommodated in cylindrical recesses 18 at the base of the slots 13 which locate the bridging members so that the bridging members are urged outwardly of the slot and into engagement with the switch wafer as shown. Each bridging member has two deformations 20 on the web part 21 thereof and these afford line contact with the respective pads 3 and 4 of the wafer of FIG. 1. The bridging member being short in length has negligible inductance since it provides a straight line path between the pads 3 and 4 and moreover floating connection with the spring ensures even distribution of pressure between the pads 3 and 4.

What we claim is:

1. A printed switch wafer for use in rotary printed circuit switches of the type having rotatable bridging contact means to effect various switching actions, said printed circuit wafer comprising an insulating substrate which has applied to it by a printed circuit technique two concentric rings of contact pads and interconnecting parts which interconnect adjacent pads of one ring of pads and further interconnecting parts which interconnect corresponding pads of the two rings, each of the interconnecting parts having a hole therein for locating the cutting bit of a metal-removing tool for breaking the electrical interconnections provided by said parts.

2. A printed switch wafer as claimed in claim 1, in which adjacent pads of both rings of pads are interconnected by printed interconnecting parts which have holes therein for locating the tool cutting bit.

3. A printed switch wafer as claimed in claim 2, comprising printed intermediate pads located between the pads of one of said rings of pads with interconnecting parts joining the intermediate pads to adjacent pads so that a "make-before-break" action is provided as the bridging contact means moves from one pair of corresponding pads to another, each of the interconnecting parts being provided with a hole for locating the bit of a metal-removing tool for the electrical connections afforded by the interconnecting parts.

4. A rotary switch comprising a printed switch wafer as claimed in claim 1 and rotor bridging contact means cooperating with the concentric rings of contact pads on said printed wafer, said rotor bridging contact means comprising at least one pad bridging member of short length carried by the rotor body and acted on by individual spring means to urge the member into contact with the printed wafer.

5. A rotary switch as claimed in claim 4, in which the rotor body is of cylindrical form having in one radial surface thereof a plurality of radially-extending slots which define selectable positions around the rotor for metal pad-bridging members of channel shape acted on at their centres by coiled springs contained within recesses of the rotor body.

References Cited

UNITED STATES PATENTS

| | | | |
|---|---|---|---|
| 2,627,006 | 1/1953 | Lawson et al. | 200—166 XR |
| 2,758,256 | 8/1956 | Eisler | 317—101 |
| 2,868,906 | 1/1959 | Soreng | 200—11.23 XR |
| 2,896,033 | 7/1959 | Hartz | 200—11 |
| 3,200,210 | 8/1965 | Alonas et al. | 200—11 |
| 3,319,016 | 5/1967 | Hoy et al. | 200—166 XR |
| 3,361,936 | 1/1968 | Umantsev | 317—101 |
| 2,908,777 | 10/1959 | Brown | 200—11.23 |
| 2,985,726 | 5/1961 | Handel | 200—11.23 |

ROBERT K. SCHAEFER, Primary Examiner

J. R. SCOTT, Assistant Examiner

U.S. Cl. X.R.

200—166